(12) United States Patent
Dick

(10) Patent No.: US 9,337,886 B1
(45) Date of Patent: May 10, 2016

(54) DIGITAL PRE-DISTORTION WITH SHARED OBSERVATION PATH RECEIVER

(71) Applicant: Xilinx, Inc., San Jose, CA (US)

(72) Inventor: Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 19 days.

(21) Appl. No.: 14/137,177

(22) Filed: Dec. 20, 2013

(51) Int. Cl.
| | |
|---|---|
| H04K 1/02 | (2006.01) |
| H04L 25/03 | (2006.01) |
| H04L 25/49 | (2006.01) |
| H04B 1/62 | (2006.01) |
| H04B 1/04 | (2006.01) |

(52) U.S. Cl.
CPC ............... *H04B 1/62* (2013.01); *H04B 1/0475* (2013.01)

(58) Field of Classification Search
CPC ....... H03F 1/3247; H03F 3/24; H03F 1/3241; H04L 27/368; H03G 3/3042
USPC .................................. 375/295–297, 219–221
See application file for complete search history.

(56) References Cited

U.S. PATENT DOCUMENTS

| | | | | |
|---|---|---|---|---|
| 8,170,507 | B2 * | 5/2012 | Wang | H03F 1/3241 375/297 |
| 9,031,521 | B2 * | 5/2015 | Yang | H03F 1/3247 375/296 |
| 2008/0159435 | A1 * | 7/2008 | Cohen | H03F 1/3247 375/297 |
| 2012/0263256 | A1 * | 10/2012 | Waheed | H04B 1/0475 375/296 |
| 2013/0094550 | A1 * | 4/2013 | Coan et al. | 375/222 |
| 2013/0102254 | A1 * | 4/2013 | Cyzs | H04B 1/126 455/63.1 |

* cited by examiner

*Primary Examiner* — James M Perez
(74) *Attorney, Agent, or Firm* — Gerald Chan; Robert M. Brush

(57) ABSTRACT

A system for digital pre-distortion includes: a transmitter configured to transmit at least one transmission data signal; a receiver configured to receive at least one receive data signal and to receive the at least one transmission data signal; and at least one amplifier, associated with the transmitter, configured to receive at least one pre-distortion control signal sent from the receiver; wherein the at least one pre-distortion control signal is related to the at least one transmission data signal.

13 Claims, 8 Drawing Sheets

DIGITAL PRE-DISTORTION WITH SHARED OBSERVATION PATH RECEIVER

FIELD

An embodiment described herein relates to digital pre-distortion. In particular, it relates to digital pre-distortion with a shared observation path receiver.

BACKGROUND

Each antenna in a base station (e.g., a communication cell tower, or any form of communication link) has associated with it a radio frequency (RF) transmission chain and a RF receive chain, referred to as a data receiver. There is most commonly an additional receiver, referred to as an observation receiver, which monitors the output of the power amplifier in the transmission chain. The data from the observation receiver is returned to a digital front-end (DFE) processor, where it is used in a digital pre-distorter (DPD) that linearizes the power amplifier. The DPD inversely models the power amplifier's gain and phase characteristics and, when combined with the amplifier, produces an overall system that is more linear and reduces the power amplifier's distortion. In short, then, each antenna is serviced by one transmission path and two receive paths. However, in the increasingly common time division duplexing (TDD) protocols that are used in, for example, long term evolution (LTE) wireless systems, there are periods of time in which a data path receiver is not engaged and remains idle. One or more embodiments described herein allow a reduction in the cost of a RF shelf by time-sharing a single receiver between the functions of the data receiver and the observation path receiver.

SUMMARY

A system for digital pre-distortion includes: a transmitter configured to transmit at least one transmission data signal; a receiver configured to receive at least one receive data signal and to receive the at least one transmission data signal; and at least one amplifier, associated with the transmitter, configured to receive at least one pre-distortion control signal sent from the receiver; wherein the at least one pre-distortion control signal is related to the at least one transmission data signal.

Optionally, the system further includes at least one processor configured to generate the at least one pre-distortion control signal by using the at least one transmission data signal.

Optionally, a frequency band of the at least one transmission data signal and a frequency band of the at least one receive data signal are a same frequency band.

Optionally, the at least one transmission data signal and the at least one receive data signal are time division duplexed (TDD).

Optionally, the receiver is configured to receive the at least one receive data signal during a first time period, and to receive the at least one transmission data signal during a second time period.

Optionally, the first time period and the second time period do not overlap in time.

Optionally, the first time period repeats after a first time interval, and the second time period repeats after a second time interval.

Optionally, a frequency band of the at least one transmission data signal and a frequency band of the at least one receive data signal are different frequency bands.

Optionally, the at least one transmission data signal and the at least one receive data signal are frequency division duplexed (FDD).

Optionally, the system further includes at least one filter to filter the at least one receive data signal and the at least one transmission data signal, to separate out the at least one receive data signal from the at least one transmission data signal.

Optionally, the system further includes at least one downconverter configured to downconvert the at least one receive data signal and the at least one transmission data signal.

A method for digital pre-distortion includes: transmitting, with a transmitter, at least one transmission data signal; receiving, with a receiver, at least one receive data signal; receiving, with the receiver, the at least one transmission data signal; and sending, with the receiver, at least one pre-distortion control signal to at least one amplifier associated with the transmitter; wherein the at least one pre-distortion control signal is related to the at least one transmission data signal.

Optionally, the method further includes generating the at least one pre-distortion control signal using the at least one transmission data signal.

Optionally, a frequency band of the at least one transmission data signal and a frequency band of the at least one receive data signal are a same frequency band.

Optionally, the at least one transmission data signal and the at least one receive data signal are time division duplexed (TDD).

Optionally, the act of receiving the at least one receive data signal occurs during a first time period; and wherein the act of receiving the at least one transmission data signal occurs during a second time period.

Optionally, the first time period and the second time period do not overlap in time.

Optionally, the first time period repeats after a first time interval, and the second time period repeats after a second time interval.

Optionally, a frequency band of the at least one transmission data signal and a frequency band of the at least one receive data signal are different frequency bands.

Optionally, the at least one transmission data signal and the at least one receive data signal are frequency division duplexed (FDD).

Other and further aspects and features will be evident from reading the following detailed description of the embodiments.

DESCRIPTION OF THE FIGURES

The drawings illustrate the design and utility of embodiments, in which similar elements are referred to by common reference numerals. These drawings may or may not be drawn to scale. In order to better appreciate how the above-recited and other advantages and objects are obtained, a more particular description of the embodiments will be rendered, which are illustrated in the accompanying drawings. These drawings depict only exemplary embodiments and are not therefore to be considered as limiting in the scope of the claims.

DETAILED DESCRIPTION

Figure 1:
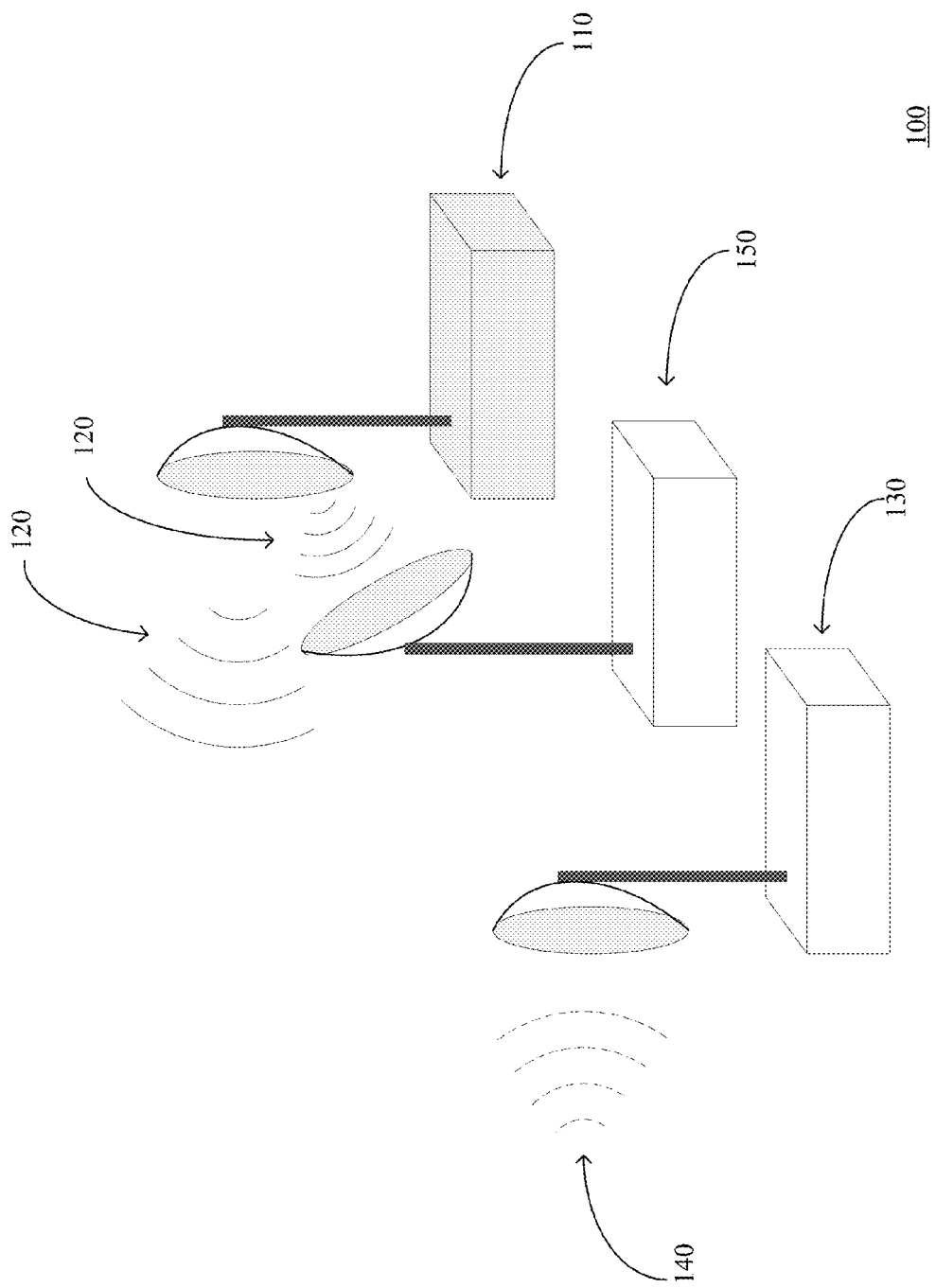
FIG. 1 is a schematic diagram depicting a system for pre-distortion.

Various embodiments are described hereinafter with reference to the figures. It should be noted that elements of similar structures or functions are represented by like reference numerals throughout the figures. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

In the following description, numerous details are set forth in order to provide a more thorough description of the system. It will be apparent, however, to one skilled in the art, that the disclosed system and method may be practiced without these specific details.

The methods and systems disclosed herein provide digital pre-distortion with a shared receiver. In one embodiment, this system time-shares a single receiver between the functions of a data receiver and an observation path receiver, thereby reducing the cost of the RF shelf. The advantages of this system is the simplification, reduction in bill of materials (BOM), reduction in power, and reduction in cost, which are enabled by multiplexing a single RF receiver chain over the functions of a data path receiver and the DPD observation receiver. In particular, the present disclosure proposes to time-share a receiver, and use it for both the data receiver and the observation path receiver for the digital pre-distorter (DPD) circuit. This may be accomplished with TDD systems in which the transmission and receive frequency bands are the same. Such configuration allows only a single RF circuit to be designed for a single frequency, and one frequency is common to both the downlink and the uplink. For a frequency division duplexing (FDD) system, a different technique may be used. In one embodiment described herein, for an FDD system, the system may employ a time-share receiver that is broadband enough to cover both the transmission and receiver frequency bands, which may be different from one another.

FIG. 1 is a schematic diagram depicting a system 100 for pre-distortion. In this figure, a transmitter 110 is transmitting at least one transmission data signal 120 to at least one user (not shown). In addition, a data receiver 130 is receiving at least one receive data signal 140 from at least one user. Also, an observation receiver 150 is receiving at least one transmission data signal 120 that is transmitted from the transmitter 110.

Figure 2:
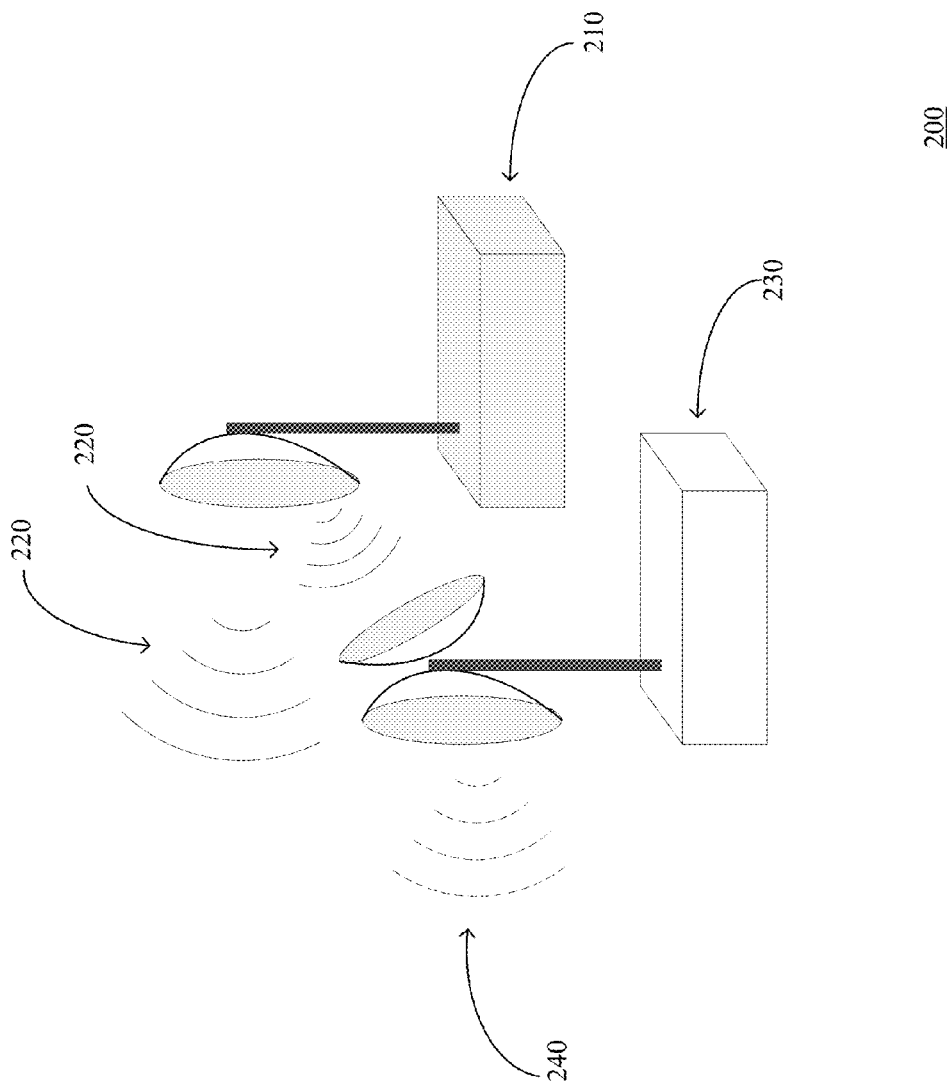
FIG. 2 is a schematic diagram depicting a system for digital pre-distortion with a shared observation path receiver.

FIG. 2 is a schematic diagram depicting a system 200 for digital pre-distortion with a shared observation path receiver. In this figure, a transmitter 210 is transmitting at least one transmission data signal 220 to at least one user (not shown). In addition, a receiver 230 is receiving at least one receive data signal 240 from at least one user. The receiver 230 is also receiving at least one transmission data signal 220 that is transmitted from the transmitter 210.

Figure 3:
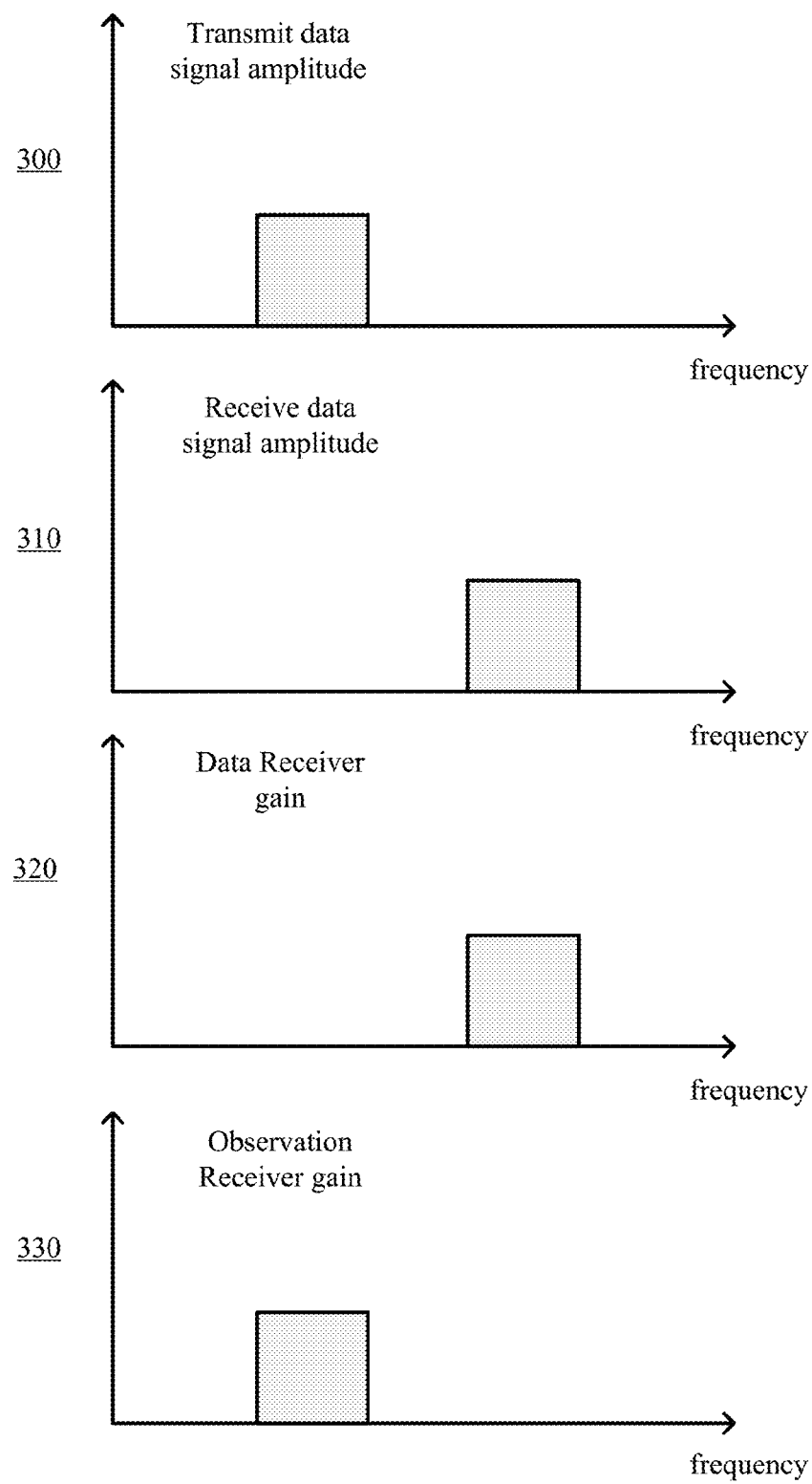
FIG. 3 is a series of graphs showing exemplary signals employed by a system for pre-distortion utilizing frequency division duplexing (FDD).

FIG. 3 is a series of graphs 300, 310, 320, 330 showing exemplary signals employed by a system (e.g., the system 100 of FIG. 1) for pre-distortion utilizing frequency division duplexing (FDD). In this figure, for graphs 300 and 310, the y-axes denote amplitude and the x-axes denote frequency. Graph 300 shows an exemplary transmit data signal having an amplitude over a specified frequency band, and graph 310 shows an exemplary receive data signal having an amplitude over a specified frequency band. From these graphs, it is evident that the transmit data signal and the receive data signal have different frequency bands.

For graphs 320 and 330, the y-axes denote gain and the x-axes denote frequency. Graph 320 shows the data receiver gain over a specific frequency band, and graph 330 shows the observation receiver gain over a specified frequency band.

Figure 4:
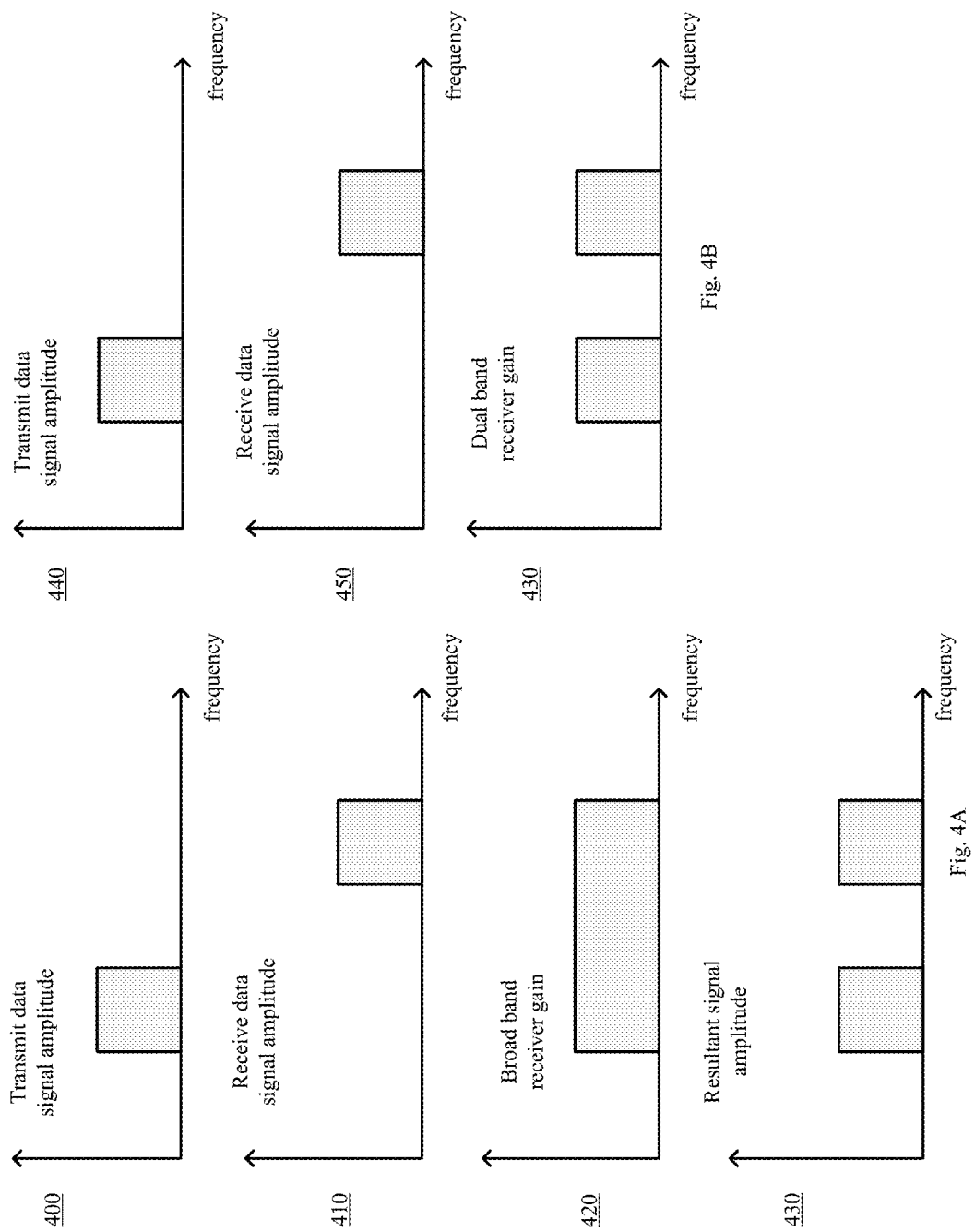
FIG. 4A is a series of graphs showing exemplary signals employed by a system for digital pre-distortion with a shared observation path receiver utilizing FDD which utilizes a broad band receiver.
FIG. 4B is a series of graphs showing exemplary signals employed by the disclosed system for digital pre-distortion with a shared observation path receiver utilizing FDD which utilizes a dual band receiver.

FIG. 4A is a series of graphs 400, 410, 420, 430 showing exemplary signals employed by a system (e.g., the system 200 of FIG. 2) for digital pre-distortion with a shared observation path receiver utilizing FDD in accordance with some embodiments. In some embodiments, the receiver may be a broad band receiver. In this figure, for graphs 400 and 410, the y-axes denote amplitude and the x-axes denote frequency. Graph 400 shows an exemplary transmit data signal having an amplitude over a specified frequency band, and graph 410 shows an exemplary receive data signal having an amplitude over a specified frequency band. From these graphs, it is evident that the transmit data signal and the receive data signal have different frequency bands.

For graph 420, the y-axis denotes gain and the x-axis denotes frequency. Graph 420 shows the broad band receiver gain over a specific frequency band, which encompasses both the transmit data signal's frequency band and the receive data signal's frequency band. For graph 430, the y-axis denotes amplitude and the x-axis denotes frequency. Graph 430 shows the amplitude of resultant signal, after filtering (using one or more filters in the system), having the two different frequency bands of the transmit data signal and the receive data signal.

FIG. 4B is a series of graphs 440, 450, 460 showing exemplary signals employed by a system (e.g., the system 200 of FIG. 2) for digital pre-distortion with a shared observation path receiver utilizing FDD. In some embodiments, the receiver may be a dual band receiver. In this figure, for graphs 440 and 450, the y-axes denote amplitude and the x-axes denote frequency. Graph 440 shows an exemplary transmit data signal having an amplitude over a specified frequency band, and graph 450 shows an exemplary receive data signal having an amplitude over a specified frequency band. From these graphs, it is evident that the transmit data signal and the receive data signal have different frequency bands.

For graph 460, the y-axis denotes gain and the x-axis denotes frequency. Graph 460 shows the dual band receiver gain over two specific frequency bands, which correspond to the transmit data signal's frequency band and the receive data signal's frequency band.

Figure 5:
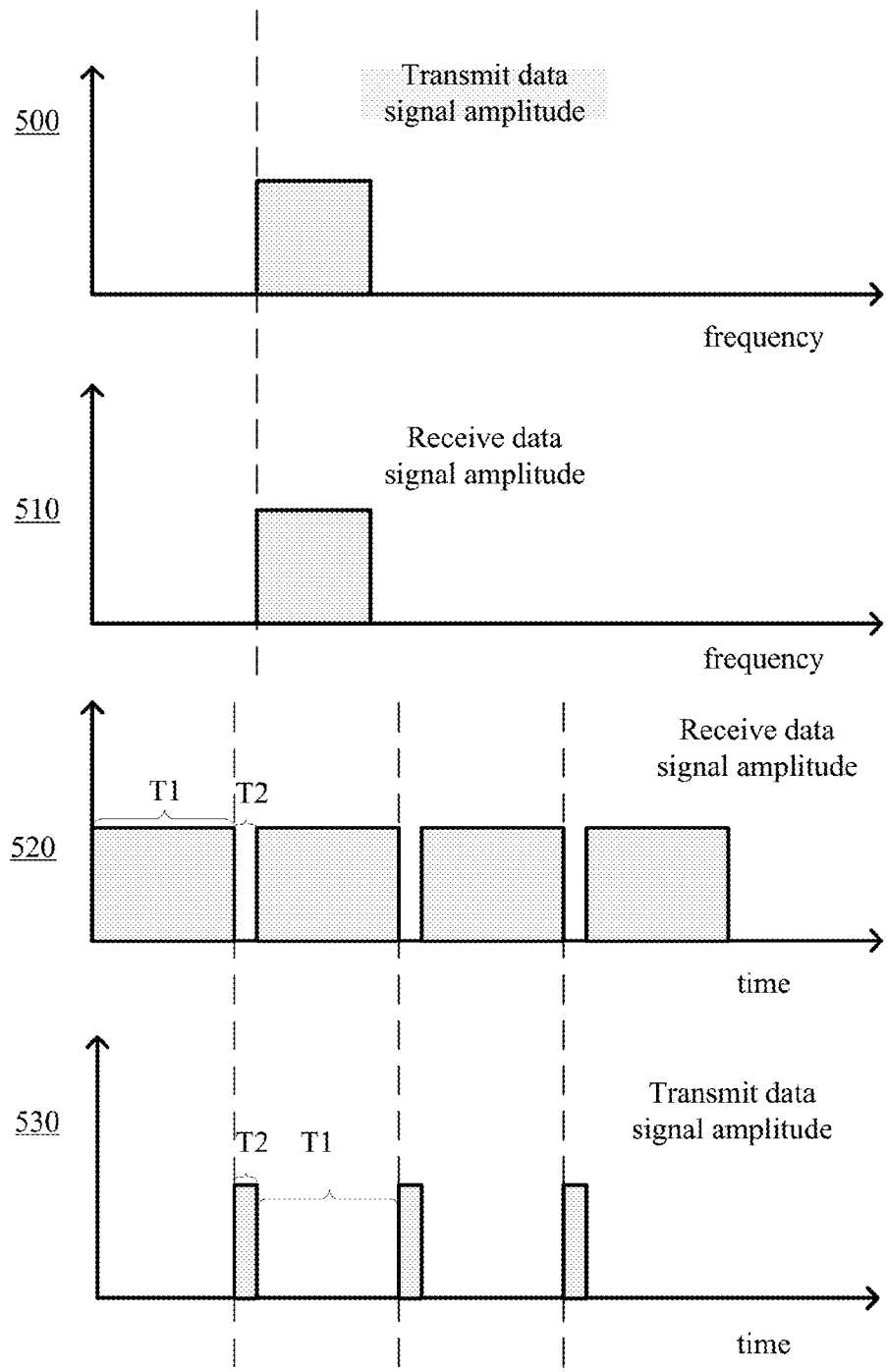
FIG. 5 is a series of graphs showing exemplary signals employed by a system for digital pre-distortion with a shared observation path receiver utilizing time division duplexing (TDD).

FIG. 5 is a series of graphs 500, 510, 520, 530 showing exemplary signals employed by a system (e.g., the system 200 of FIG. 2) for digital pre-distortion with a shared observation path receiver utilizing time division duplexing (TDD) in accordance with other embodiments. In this figure, for graphs 500 and 510, the y-axes denote amplitude and the x-axes denote frequency. Graph 500 shows an exemplary transmit data signal having an amplitude over a specified frequency band, and graph 510 shows an exemplary receive data signal having an amplitude over a specified frequency band. From these graphs, it is evident that the transmit data signal and the receive data signal have the same frequency band.

For graphs 520 and 530, the y-axes denote amplitude and the x-axes denote time. Graph 520 shows exemplary samples of the receive data signal received by the receiver (e.g., the receiver 230 of FIG. 2) during specified time periods T1 that are separated by a certain time intervals T2. Graph 530 shows exemplary samples of the transmit data signal received by the receiver (e.g., the receiver 230 of FIG. 2) during specified time periods T2 that are separated by a certain time intervals T1.

In the illustrated example, the time periods T1 during which the receiver receives the receive data signal are different (i.e., have different duration) from the time periods T2 during which the receiver receives the transmit data signal. Alternatively, the time periods T1 during which the receiver receives the receive data signal may be the same (i.e., have same duration) as the time periods T2 during which the receiver receives the transmit data signal. Also, in other example, instead of having the time period T1 being longer than the time period T2 like that shown in the figure, the time period T1 may be shorter than the time period T2.

Also, in the illustrated example, the time intervals T2 associated with the receiving of the receive data signal is different from the time intervals T1 associated with the receiving of the transmit data signal. Alternatively, the time intervals T2 associated with the receiving of the receive data signal may be the same as the time intervals T1 associated with the receiving of the transmit data signal. Furthermore, in other example, instead of having the time interval T2 being shorter than the time interval T1 like that shown in the figure, the time interval T2 may be longer than the time interval T1.

Figure 6:
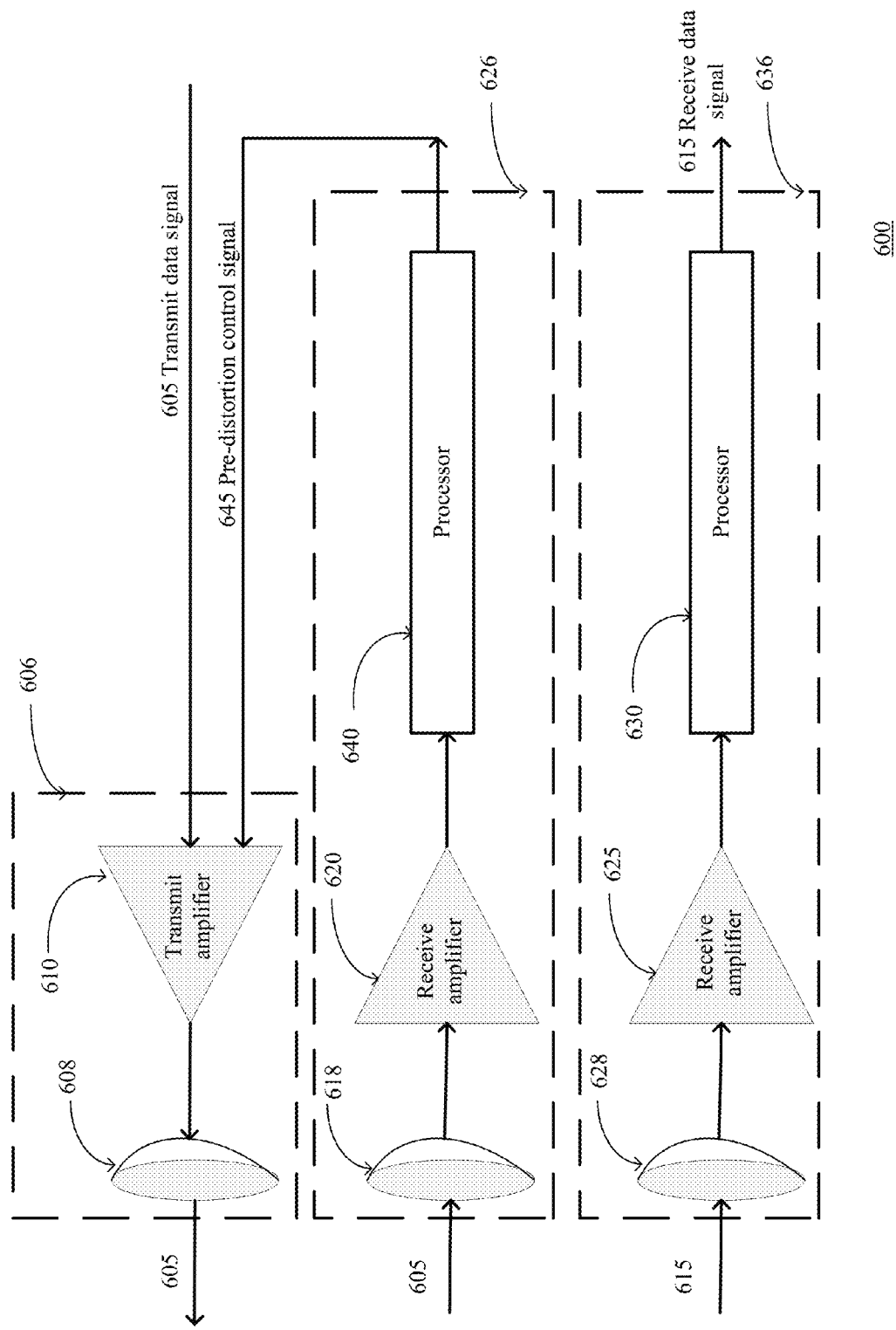
FIG. 6 is a schematic diagram showing exemplary components employed by a system for pre-distortion utilizing TDD or FDD.

FIG. 6 is a schematic diagram 600 showing exemplary components employed by a system (e.g., the system 100 of FIG. 1) for pre-distortion utilizing TDD or FDD. In this figure, a transmitter 606, which includes a transmit amplifier 610 and a transmit antenna 608, transmits a transmit data signal 605 to a user (not shown).

The transmit data signal 605 is received by an observation receiver 626, which includes a receive amplifier 620, a receive antenna 618, and a processor 640. The transmit data signal 605 is amplified by the receive amplifier 620, and is processed by the processor 640. The processor 640 uses the transmit data signal 605 to generate a pre-distortion control signal 645. The receiver 626 sends the pre-distortion control signal 645 to the transmit amplifier 610 to minimize distortion in the transmit amplifier 610.

As shown in FIG. 6, a receive data signal 615, from a user, is received by a data receiver 636, which includes a receive amplifier 625, a receive antenna 628, and a processor 630. The receive data signal 615 is amplified by the receive amplifier 625, and is processed by the processor 630.

Figure 7:
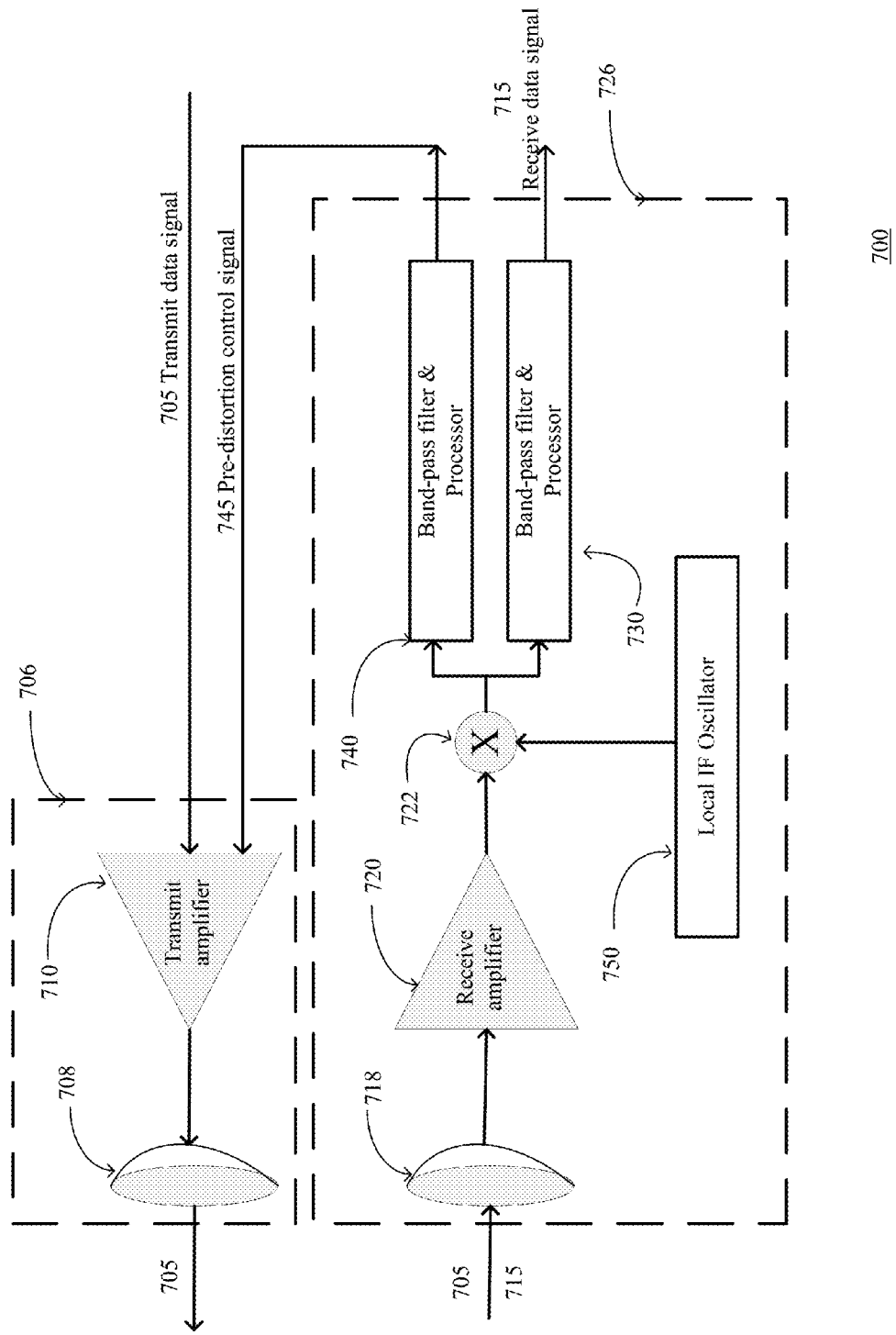
FIG. 7 is a schematic diagram showing exemplary components employed by a system for digital pre-distortion with a shared observation path receiver utilizing FDD in accordance with some embodiments.

FIG. 7 is a schematic diagram 700 showing exemplary components employed by a system (e.g., the system 200 of FIG. 2) for digital pre-distortion with a shared observation path receiver utilizing FDD in accordance with some embodiments. In this figure, a transmitter 706, which includes a transmit amplifier 710 and a transmit antenna 708, transmits a transmit data signal 705 to a user (not shown).

A receive data signal 715 from a user and the transmit data signal 705 are both received by a receiver 726, which includes a receive amplifier 720, a receive antenna 718, a first processing unit 730 (which may include band-pass filter(s) and one or more processor(s)), a second processing unit 740 (which may include band-pass filter(s) and one or more processor(s)), and a local intermediate frequency (IF) oscillator 750. As used in this specification, the term "processor" may be any types of processor, such as a general purpose processor, a signal processor, a microprocessor, a FPGA processor, an ASIC processor, or any integrated circuit configured to perform one more signal processing functions.

In the illustrated embodiments, the receiver 726 also includes a mixer 722 coupled to the amplifier 720 and the IF oscillator 750. The signal outputted from the amplifier 720 and the signal outputted from the IF oscillator 750 are inputted into the mixer 722. The mixer 722 downconverts the signal from the amplifier 720 to a lower intermediate frequency and, as such, the mixer 722 outputs a signal having a lower intermediate frequency.

In some embodiments, the receive data signal 715 is amplified by the receive amplifier 720, is downconverted by the mixer 722 based on input from the local IF oscillator 750, is filtered by the band-pass filter(s) in the first processing unit 730, and is processed by the processor(s) in the first processing unit 730.

The transmit data signal 705 is amplified by the receive amplifier 720, is downconverted by the local IF oscillator 750, is filtered by the band-pass filter(s) in the second processing unit 740, and is processed by the processor(s) in the second processing unit 740. The second processing unit 740 uses the transmit data signal 705 to generate a pre-distortion control signal 745. The receiver 726 sends the pre-distortion control signal 745 to the transmit amplifier 710 to minimize distortion in the transmit amplifier 710.

Figure 8:
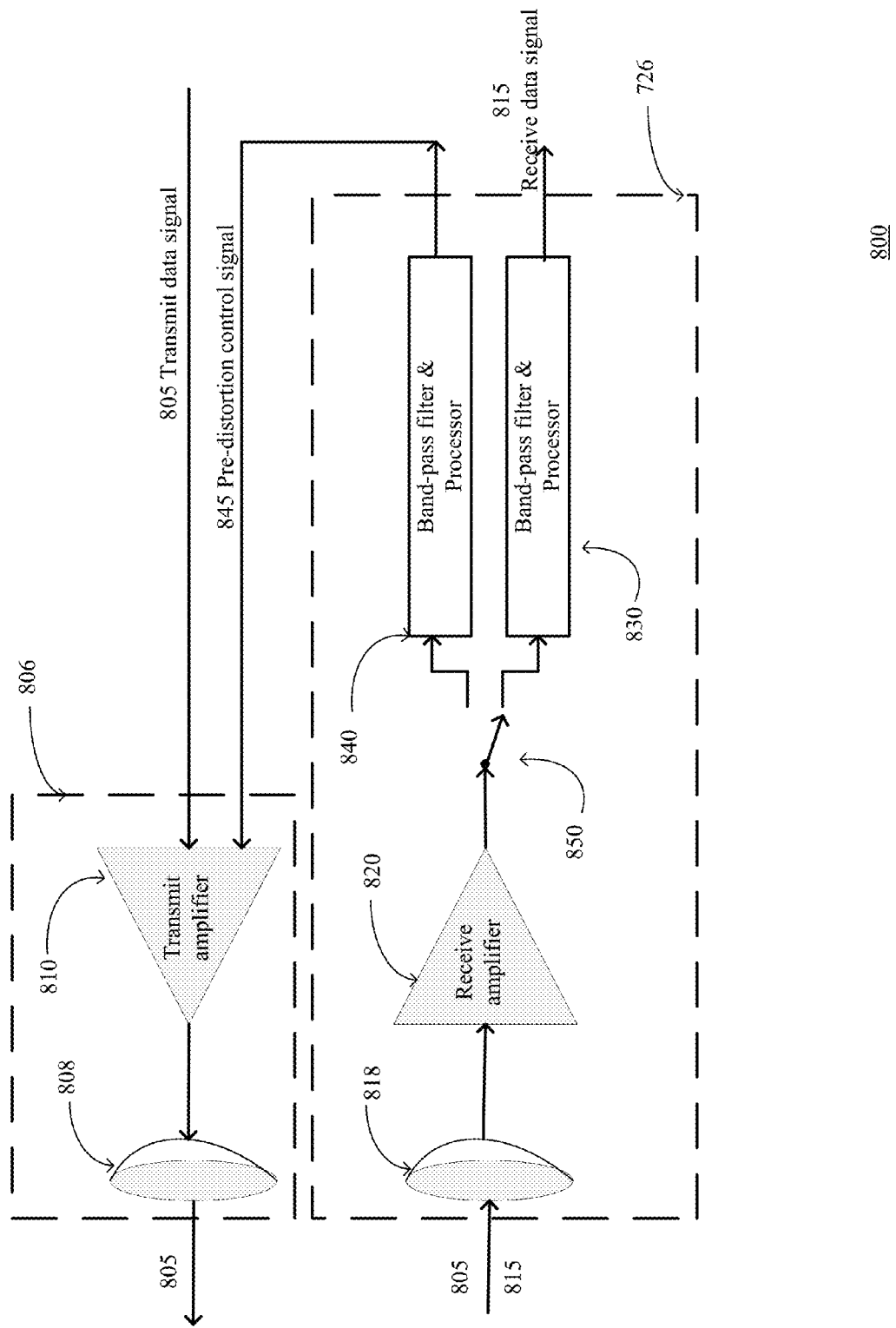
FIG. 8 is a schematic diagram showing exemplary components employed by a system for digital pre-distortion with a shared observation path receiver utilizing TDD in accordance with other embodiments.

FIG. 8 is a schematic diagram 800 showing exemplary components employed by a system (e.g., the system 200 of FIG. 2) for digital pre-distortion with a shared observation path receiver utilizing TDD in accordance with other embodiments. In this figure, a transmitter 806, which includes a transmit amplifier 810 and a transmit antenna 808, transmits a transmit data signal 805 to a user (not shown).

A receive data signal 815 from a user and the transmit data signal 805 are both received by a receiver 826 (which may be the receiver 230 of FIG. 2), which includes a receive amplifier 820, a receive antenna 818, a switch 850, a first processing unit 830 (which may include one or more processor(s)), and a second processing unit 840 (which may include one or more processor(s)). The switch 850 toggles in time over specified time intervals to separate the transmit data signal 805 from the receive data signal 815.

The receive data signal 815 is amplified by the receive amplifier 820, and is processed by the first processing unit 830. The transmit data signal 805 is amplified by the receive amplifier 820, and is processed by the second processing unit 840. The second processing unit 840 uses the transmit data signal 805 to generate a pre-distortion control signal 845. The receiver 826 sends the pre-distortion control signal 845 to the transmit amplifier 810 to minimize distortion in the transmit amplifier 810.

A further consideration relates to the scheduling of a single receiver for the data receiver operation and the DPD observation receiver operation. Consider the case of an LTE TDD system. There are seven (7) uplink/downlink frame configurations in the third generation partnership project (3GPP) LTE standard. The priority for the receiver is to service the uplink transmissions. Even with the servicing of the uplink slots as a priority, the receiver can be scheduled as an observation receiver every five (5) milliseconds, which is a satisfactory DPD servicing interval. In the worst case scenario (i.e. the worst case from the perspective of the DPD processor), the observation time may be every one (1) millisecond. If a receiver is configured for employing a sample rate of 491 megahertz (MHz), the number of samples that are collected in the available observation interval is 4.91 E5. The number of samples that the DPD processor may require in each observation may be 16384. As such, an LTE slot provides more than ample access time for the DPD processor to access the output of the power amplifier. If the receiver is operating at lower rates (e.g., 245 MHz or 122 MHz), there is still more than ample time to acquire the sample set required by the DPD processor.

Where methods described above indicate certain events occurring in certain order, those of ordinary skill in the art having the benefit of this disclosure would recognize that the ordering may be modified. Thus, in other embodiments, the order of the events in the methods described herein may be different from those described herein. Additionally, parts of methods may be performed concurrently in a parallel process when possible, as well as performed sequentially. In addition, more parts or less part of the methods may be performed.

Although certain illustrative embodiments and methods have been disclosed herein, it should be understood that the above discussion is not intended to limit the scope of the claims, and that it is apparent from the foregoing disclosure to those skilled in the art that variations and modifications of such embodiments and methods can be made. The specification and drawings are, accordingly, to be regarded in an illustrative rather than restrictive sense. The claimed inventions are intended to cover alternatives, modifications, and equivalents.

I claim:

1. A system for digital pre-distortion, comprising:
   a transmitter, coupled to a transmit antenna, configured to transmit at least one transmission data signal via the transmit antenna;
   a receiver, coupled to a receive antenna, configured to receive at least one receive data signal and to receive the at least one transmission data signal via the receive antenna;
   the receiver, comprising:
      a receive amplifier, coupled to the receive antenna, configured to amplify output of the receive antenna;
      a switch configured to separately output the amplified at least one transmission data signal and the amplified at least one receive data signal;
      at least one processor, coupled to the switch, configured to generate at least one pre-distortion control signal using the separately output at least one transmission data signal; and
   at least one transmit amplifier, within the transmitter, configured to receive the at least one pre-distortion control signal sent from the receiver and reduce distortion based on the received at least one pre-distortion control signal.

2. The system of claim 1, wherein a frequency band of the at least one transmission data signal and a frequency band of the at least one receive data signal are a same frequency band.

3. The system of claim 2, wherein the at least one transmission data signal and the at least one receive data signal are time division duplexed (TDD).

4. The system of claim 2, wherein the receiver is configured to receive the at least one receive data signal during a first time period, and to receive the at least one transmission data signal during a second time period.

5. The system of claim 4, wherein the first time period and the second time period do not overlap in time.

6. The system of claim 4, wherein the first time period repeats after a first time interval, and the second time period repeats after a second time interval.

7. The system of claim 1, further comprising at least one downconverter within the receiver configured to downconvert the at least one receive data signal and the at least one transmission data signal.

8. A method for digital pre-distortion, comprising:
   transmitting, with a transmitter and a transmit antenna, at least one transmission data signal;
   receiving, with a receiver and a receive antenna, at least one receive data signal;
   receiving, with the receiver and the receive antenna, the at least one transmission data signal;
   amplifying, with a receive amplifier within the receiver, the at least one transmission data signal and the at least one receive data signal;
   separately outputting, using a switch within the receiver, the amplified at least one transmission data signal and the amplified at least one receive data signal;
   generating, with at least one processor, at least one pre-distortion control signal using the separately output at least one transmission data signal; and
   sending, with the receiver, the at least one pre-distortion control signal to at least one transmit amplifier within the transmitter, wherein reducing distortion of the at least one transmit amplifier is performed using the received at least one pre-distortion control signal.

9. The method of claim 8, wherein a frequency band of the at least one transmission data signal and a frequency band of the at least one receive data signal are a same frequency band.

10. The method of claim 9, wherein the at least one transmission data signal and the at least one receive data signal are time division duplexed (TDD).

11. The method of claim 9, wherein the act of receiving the at least one receive data signal occurs during a first time period; and
   wherein the act of receiving the at least one transmission data signal occurs during a second time period.

12. The method of claim 11, wherein the first time period and the second time period do not overlap in time.

13. The method of claim 11, wherein the first time period repeats after a first time interval, and the second time period repeats after a second time interval.

* * * * *